United States Patent

[11] 3,611,353

[72] Inventors Richard E. Shipp
Long Beach;
George W. Smith, III, Hacienda Heights,
both of Calif.

[21] Appl. No. 810,597
[22] Filed Mar. 26, 1969
[45] Patented Oct. 5, 1971
[73] Assignee Beckman Instruments, Inc.

[54] DIGITAL-TO-ANALOG CONVERTER
6 Claims, 2 Drawing Figs.

[52] U.S. Cl. .......... 340/347 DA
[51] Int. Cl. .......... H03k 13/02
[50] Field of Search .......... 307/279, 255; 340/347; 324/105

[56] References Cited

UNITED STATES PATENTS 3,281,832 10/1966 Schwartz .......... 340/347
3,475,749 10/1969 Plice .......... 340/347
3,487,304 12/1969 Kennedy .......... 340/347 X

*Primary Examiner*—Maynard R. Wilbur
*Assistant Examiner*—Charles D. Miller
*Attorneys*—Paul R. Harder and Robert J. Steinmeyer

ABSTRACT: This disclosure relates to a digital-to-analog converter having digital integrated circuit switches in place of the heretofore-used analog switches. A multiplicity of digital input leads are connected to at least one digital integrated circuit having a plurality of digital transistor switches. A multiplicity of resistors are connected between a common terminal and the digital switches. In order to accommodate the use of digital switches in the place of analog switches, a compensating reference voltage source is connected to the digital integrated circuit and also to a reference input of an analog operational amplifier. The signal input of the operational amplifier is connected to the common terminal of the resistors. By selective operation of the digital switches, the various resistors are connected between the compensating voltage reference source and the signal input of the operational amplifier. The currents produced thereby are summed by the operational amplifier to produce an analog output voltage in proportion to the current sum. The compensating reference voltage source in the circuit configuration disclosed allows the use of digital integrated circuit switches heretofore not possible.

Figure 2:
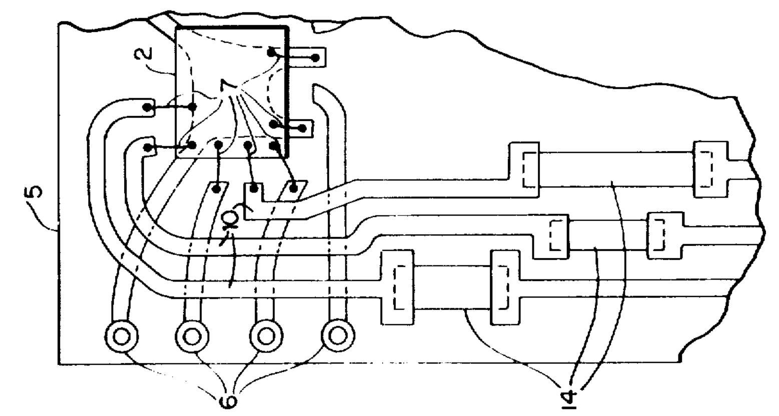

INVENTORS
GEORGE W. SMITH
RICHARD E. SHIPP
BY Paul K. Harder
ATTORNEY

DIGITAL-TO-ANALOG CONVERTER

A digital-to-analog converter is disclosed in which digital integrated circuit switches are employed in the conversion of a digital signal to an analog output voltage.

Digital-to-analog converters (DAC) are primarily used in data display systems. Basically, the DAC operates upon digital word outputs from a digital data system such as a computer and converts them to analog voltages which may be displayed on oscilloscopes, oscillographs and recorders. Ease of observation is provided by changing from a difficult to read digital code to an easily interpreted visual light beam, light spot, pen, line or other similar position display.

Another use for the DAC is a digital function generator wherein a desired analog signal is generated in response to a predetermined digital program.

A typical DAC uses digital word inputs to switch precise analog switches. In order to obtain precision in a DAC, the switches should have negligible saturation voltage when rendered conductive and a very low value of offset or leakage current when rendered nonconductive. In addition the resistance when conductive should be small and when rendered nonconductive should be very large. The switching action of such a switch should closely follow the rise or fall of a control switching voltage.

In existing DAC±these requirements are met, with varying success, by typical analog switches such as; bipolar junction transistors (BJT), junction field effect transistors (J—FET), and metal oxide semiconductor field effect transistors (MOSFET).

In order to meet the small size and cost requirements demanded by most DAC applications, it would be desirable to have a low-cost integrated circuit (IC) analog switch configuration available to the designer. However, such low-cost IC analog switches are not yet within the state of the art.

BJT analog switches are rarely built as monolithic integrated circuits because the expense is prohibitive.

Since the voltage output levels of most logic circuits are too small to control a J—FET switch, a driver amplifier is commonly used as the interface between a logic IC and the J—FET. The resulting assembly consisting of both integrated circuits and discrete components makes small size difficult to obtain.

The MOSFET is more ideally suited to monolithic integrated circuits. Compared to bipolar integrated circuits, many more MOSFET's can be put in an integrated circuit with less than one-third of the processing steps. However, the quality of performance is less than that obtained with J—FET's, since resistance varies with control and signal voltage, leakage current is greater in magnitude by about 10 times, a larger magnitude of control voltage is required, and the common substrate of an integrated circuit MOSFET imposes biasing problems. Therefore, the precision analog switch in integrated circuit form having performance qualities approaching discrete analog transistor switches is not available to the designer in low-cost versatile designs.

The use of digital transistor switches as DAC switches has not been possible heretofore, because of the undesirable voltage appearing across such a switch when rendered conductive by driving the digital transistor into saturation. In addition the saturation voltage has an undesirable temperature coefficient. Therefore, the wide variety of digital integrated circuit switches available have not been capable of utilization as DAC switches prior to this invention.

It is the object of this invention to provide a digital-to-analog converter circuit which accepts digital integrated circuit switches in place of the conventional analog switches thereby taking advantage of the low-cost and wide variety of digital integrated circuits available to the designer.

A further objective of the invention is to provide a circuit configuration incorporating a compensating reference voltage source by which the heretofore undesirable performance qualities of digital integrated circuit switches may be compensated.

Still another objective is to provide a circuit configuration consisting of digital integrated circuit switches, deposited film resistors, deposited conducting paths, and other associated components which are mounted on a small nonconductive base member to produce a digital-to-analog converter having a low cost and small size with high reliability and functional performance.

Figure 1:
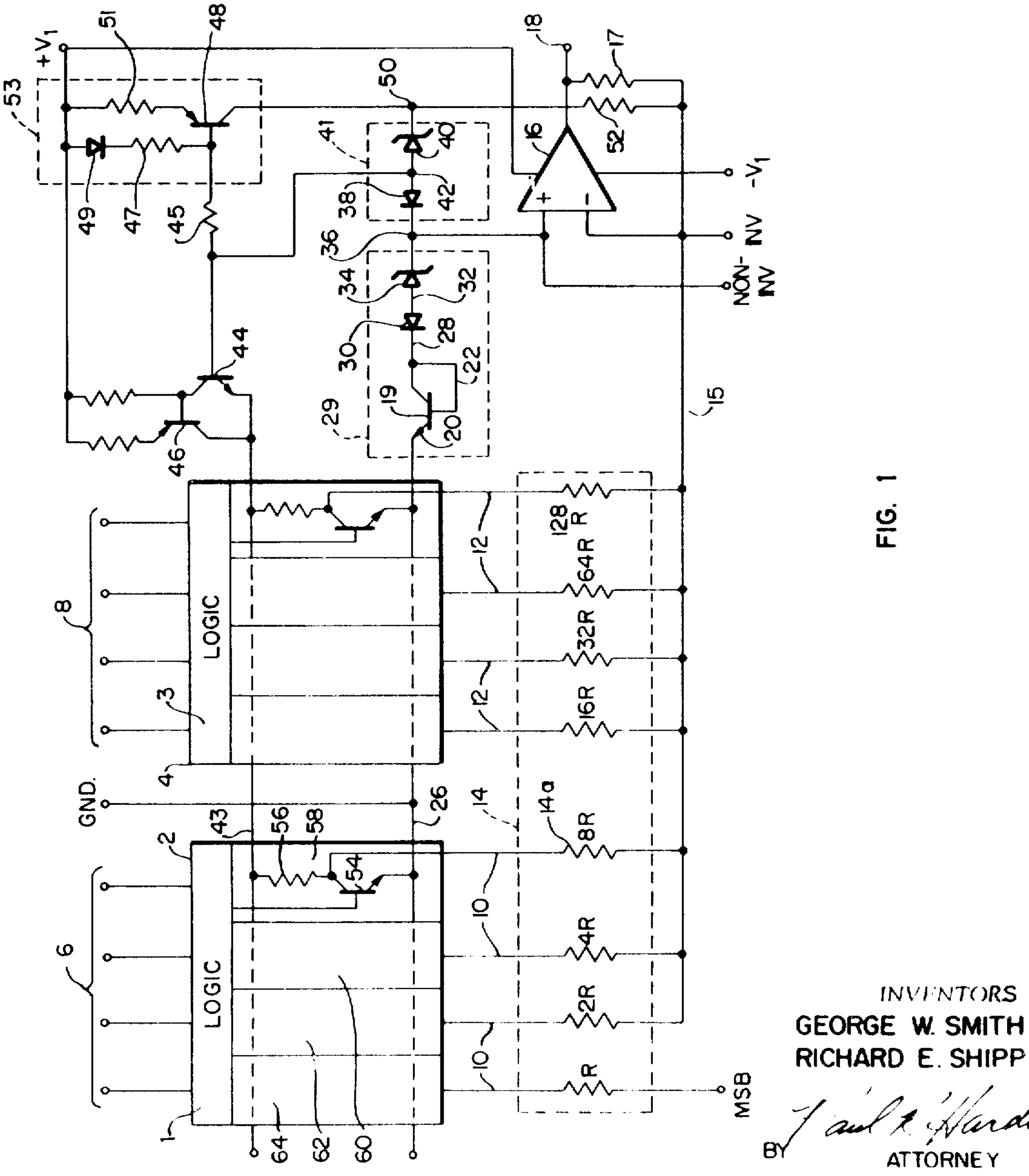

Since the need for DAC's is expanding rapidly and digital solid state switching techniques have developed more extensively than analog techniques, a still further purpose of this invention is to combine this DAC need with the digital integrated circuit switching technological advances to provide a low-cost DAC capable of interfacing directly between digital and analog circuitry for application in display and waveform generation. These and other objectives will become more apparent upon reference to the Figures wherein:

FIG 1 illustrates a circuit configuration of an exemplary embodiment of the digital-to-analog converter constructed according to the teachings of this invention; and, FIG. 2 illustrates a section of a nonconductive base member with conductive paths and components attached to construct an exemplary embodiment of a digital-to-analog converter according to the teachings of this invention.

Referring now to FIG. 1, two groups of digital input leads 6 and 8 are connected to the separate but identical digital integrated circuit blocks 2 and 4. Although a total of eight leads are shown for an eight-bit parallel input digital word, it is apparent that a greater or less number of inputs can be used corresponding to the number of switches and the associated logic circuitry employed. The integrated circuit block 2 contains input logic 1 and the digital switches 58, 60, 62 and 64 which are connected by output leads 10 to a part of resistors 14. Similarly, integrated circuit block 4 contains input logic 3 and digital switches similar to those in block 2 connected by output leads 12 to the remaining part of resistors 14. The resistors 14 have specific values related to a digital input code and herein are shown with arithmetic weighted values of R, 2R, 4R, 8R, etc., for a parallel binary input code and are connected to one common line 15. An amplifier 16 such as an analog integrated circuit operational amplifier is connected to line 15 by an inverting (INV) input indicated by a minus sign. The output terminal 18 of the operational amplifier is connected to line 1 through feedback resistor 17.

A noninverting (NON-INV) input to operational amplifier 16, indicated by a plus sign, is connected to junction 36. Also connected to junction 36 is the cathode of a zener diode 34. The anode a diode 30 is connected to the anode of zener diode 34. The cathode of diode 30 is connected to the collector and base of transistor 19. Transistor 19 is connected as a quasi-diode having the base 22 and collector 24 connected together and the emitter 20 connected to ground line 26. The combination of elements from line 36 to terminal 26 comprises the compensating reference voltage source 29. Line 26 is also connected to one power supply terminal of both integrated circuits 2 and 4.

Connected to terminal 3 is also the cathode of diode 38. To the anode of diode 38, also designated as junction 42, are connected the base of transistor 44 and resistor 45. The collector of transistor 44 is connected to the base of transistor 46 and is also connected through a resistor to a terminal $+V_1$. The emitter of transistor 44 and the collector of transistor 46 are connected together to the other power supply terminal of both integrated circuits 2 and 4 by line 43. The emitter of transistor 46 is connected through a resistor to terminal $+V_1$. Diode 38 provides a voltage drop equivalent in magnitude and temperature coefficient to the voltage drop from the base of emitter of transistor 44. Therefore, the voltages at terminal 36 and line 43 are essentially equal and identified as the compensating reference voltage. Base bias for transistor 44 is supplied through resistor 45 connected to resistor 47 which in turn is connected to the cathode of diode 49. The anode of diode 49 is connected to terminal $+V_1$. The combination of transistors 44 and 46 provide a high current gain from junction 42 to line 43 thereby isolating line 43 from junction 42 but coupling to line 43 the voltage appearing at junction 42.

The collector of transistor 48 and the anode of zener diode 40 are connected to junction 50. Transistor 48 provides current through zener diode 40 the anode of which is connected to junction 42 and the string of components connected to terminal 42 consisting of diode 38, zener diode 34, diode 30 and transistor 19. In addition transistor 48 provides current to polarity resistor 52 connected between junction 50 and line 15. The current for transistor 48 is determined by resistor 51, connected between the emitter of transistor 48 and terminal $+V_1$, in response to the voltage impressed at the base of transistor 48 by the voltage drop from terminal $+V_1$ across diode 49 and resistor 47, the junction of resistor 47 and 45 being connected to the base of transistor 48. Diode 49 compensates for the temperature coefficient of the emitter-base junction voltage of transistor 48. The combination of transistor 48, diode 49 and resistors 47 and 51 comprise the current source 53. Zener diode 40 and diode 38 comprise the polarity reference voltage source 41.

The terminals $+V_1$ and $-V_1$ are connected to external supply voltages which are referenced to ground line 26. In addition the most significant bit terminal (MSB) is made available to allow a variety of digital input codes such as magnitude plus sign, one's complement, and two's complement, to be converted to an analog voltage output. For a parallel binary input code, the MSB terminal is normally connected to line 15.

Referring now to digital switch 58, transistor 54 and resistor 56 illustrate the circuit components of digital switches 58, 60, 62, and 64 contained in the integrated circuits 2 and 4. The emitter of transistor 54 is connected to ground line 26. The base of transistor 54 is connected to the input logic 1. The collector of transistor 54 is connected to resistor 56 which is internal to the integrated circuit. The collector is also connected to a resistor 14*a* which is one of the group of resistors 14.

Illustrated in FIG. 2 is a section of a nonconductive base member 5 such as steatite, alumina, or other nonconductive material employed in the microcircuit field, to which the various electrical components are attached. The group of digital inputs 6 are deposited conductive paths which lead to integrated circuit 2 and to which external connections may be made. Integrated circuit 2 is connected to the conductive paths by means of bonding leads 7. The integrated circuit switch output leads 10 are formed as deposited conductive paths 10 which connect to deposited layer resistors 14. As can be seen in FIG. 2, the deposited conductive paths 10 are sometimes required to cross over one another. In such case the paths are suitably insulated from the other at the crossover point. This crossover technique results in use of a minimum of space for the interconnection of components.

The general operation of the DAC hereinabove described in FIG. 1 is discussed first briefly as follows.

It is the purpose of the DAC switches typically described in terms of transistor 54 to be rendered conductive or nonconductive in response to a digital word input applied to the DAC digital inputs 6 and 8. A given digital word activates certain digital switches by means of the input logic. Through these switches certain resistors of the group of resistors 14 are switched to ground line 26. Current flows through these certain switched resistors in response to the voltage appearing at the common line 15 to which the resistors are connected.

This voltage at line 15 is established by a compensating reference voltage source 29 connected to the NON-INV input to high-gain amplifier 16. Amplifier 16 is connected as an operational amplifier having a feedback resistor 17 connected from the amplifier output terminal 18 to line 15 to which the INV input of amplifier 16 is also connected. The operational connection thus described maintains the voltage at the INV and NON-INV terminals of amplifier 16 essentially equal.

The total current which flows through the certain switched resistors 14 also flows through the feedback resistor 17, there being negligible current flow into or out of the amplifier INV terminal. Therefore, the voltage which appears at output terminal 18 of amplifier 16 is directly related to the certain switched resistors.

If, as herein shown in FIG. 1, the resistors 14 are weighted arithmetically as R, 2R, 4R, 8R, etc., an input digital word comprising a parallel binary code can produce an output voltage directly proportional in value to the number represented by the binary code. Thereby, the DAC converts a digital binary code into a corresponding analog voltage.

The detailed operation of the digital-to-analog converter can best be understood by again referring to FIG. 1. The digital switch, transistor 54, is rendered conductive and nonconductive by a signal applied to the base from logic circuit 1 in the integrated circuit. When transistor 54 is in the conductive state, resistor 14*a* is connected to ground lead 26. When conductive, transistor 54 has a saturation voltage appearing from collector to emitter which does not allow resistor 14*a* to reach ground potential. The saturation voltage produced thereby has a temperature coefficient which must be compensated as disclosed hereinafter to obtain a constant current through resistor 14*a* from common line 15.

When transistor switch 54 is rendered nonconductive, resistor 14*a* is connected to line 43 through resistor 56. Under this condition it is desired that no current flow through resistor 14*a*. Therefore, it is necessary that the voltage on line 15 be essentially the same as the voltage on line 43.

Referring now to the compensating reference supply voltage source 29, the compensation for the temperature coefficient of the digital transistor switch saturation voltage is provided by forward biased diode 30 and/or quasi-diode transistor 19 together with zener diode 34. The net temperature coefficient of these three components in series must be the same as the temperature coefficient of the saturation voltage of a conductive digital switch such as transistor 54. When the temperature coefficients are matched, the voltage across resistor 14*i* is constant and independent of temperature resulting in a current dependent only on resistor 14*a*. Similarly, conditions of saturation for any of the other digital switches result in current independent of temperature through the corresponding resistors 14.

By proper selection of zener diode 34 and diode 30 it is possible that transistor 19 can be eliminated and that the combination of zener diode 34 and forward bias diode 30 can together compensate for the digital switch saturation voltage temperature coefficient. Another possibility is to select the combination of transistor 19 and zener diode 34 so that diode 30 may be omitted.

To further explain the compensation for the digital switch saturation voltage it should be noted that junction 36 is connected to the noninverting (NON-INV) input of the operational amplifier 16. Since the operational amplifier 16 is a high-gain amplifier the inverting (INV) input connected to line 15 is essentially at the same potential as the NON-INV input. Therefore, if the temperature coefficient is such that the digital switch saturation voltage decreases with increasing temperature, the compensating effect of the voltage appearing at junction 36 will be to also decrease with temperature by the same amount. Consequently, the voltage across switched resistor 14*i* remains constant resulting in a constant current being maintained through resistor 14*a*. Since this current also flows through the feedback resistor 17, the output voltage at terminal 18 is also maintained constant regardless of the digital switch saturation voltage change due to temperature.

As disclosed hereinbefore, when a digital switch such as transistor 54 is rendered nonconducting, the voltage on line 15 must be essentially the same as the voltage on line 43. Since the voltage on line 15 is essentially the same as the voltage on junction 36, the voltage on line 43 must be essentially the same as the voltage on junction 36. The voltage on line 43 is derived from the voltage at junction 42 appearing at the base of transistor 44. In order that the voltage on lead 43 be the same as the voltage on junction 36, the voltage drop across diode 38 must be the same as the base emitter voltage drop of transistor 44 thereby providing two substantially equal sources of reference voltage, on of which is isolated from the other. Therefore, by proper selection of diode 38 the voltages appearing at junction 36, line 15 and line 43 are made to be essentially the same. As a result no current flows through resistor 14a. Therefore, neglecting for the moment resistor 52, no current flows through feedback resistor 17 and the voltage at output terminal 18 is identical to the voltage on line 15 and at junction 36.

Diode 38 not only compensates for the voltage drop between the emitter and base of transistor 44 but also the temperature coefficient of the voltage drop. In addition the temperature coefficient of diode 38 also compensates for the temperature coefficient of zener diode 40 such that a constant voltage provided by polarity voltage source 41 is maintained across resistor 52, the polarity resistor, to obtain a constant current through resistor 52 into line 15. Therefore, resistor 52 provides a constant polarity offset current to shift the analog output voltage at terminal 18 to a desired point of reference.

The current supplied to terminal 50 flows through the zener diode 40 and diode 38 to provide a constant voltage between terminal 50 and junction 36. Transistor 48 supplies the necessary current to junction 50. The current is determined by resistor 51 in response to the voltage appearing across diode 49 and resistor 47, less the emitter base voltage drop of transistor 48. Since diode 49 compensates for the temperature coefficient of the emitter base voltage drop of transistor 48 and resistors 51 and 47 are matched to have equal resistance temperature coefficients, a constant current into terminal 50 is maintained thereby.

Since the output voltage at terminal 18 from the operational amplifier 16 is related to the ratio of resistor 17 to the parallel combination of the switched resistors 14 and to the ratio of resistor 17 to resistor 52, it is important that the temperature coefficients of these resistors be matched in order that the output voltage not be responsive to temperature. Resistors 47, 51, 14, 52 and 17 can be fabricated as deposited layer resistors. The state of the art in deposited layer resistors such as cermet resistors is such that resistive temperature coefficients can be matched very closely resulting in excellent temperature performance. Cermet resistors are ideal for the DAC herein described since they are formed by a plurality of minute conductive particles distributed uniformly throughout a glass or ceramic binder material and are easily deposited on a nonconducting base member.

As illustrated in FIG. 2, the components of the DAC are mounted on nonconductive base member 5 to provide a complete digital-to-analog converter assembled in a module form of low-cost and small size. In particular the use of deposited layer resistors 14 and deposited conductive paths 10 as well as integrated circuit 2 are important to the low-cost small package concept. Upon completion the base member with attached components is encapsulated to protect the individual discrete, integrated and deposited components from the environmental effects to which they may be subjected.

The use of circuit components having desirable temperature coefficients to form a compensating reference voltage source connected in the manner shown provides a digital to analog converter using integrated circuit digital switches which was heretofore not possible. The digital integrated circuit switches in conjunction with deposited layer resistors make possible a digital-to-analog converter module having small size, low-cost and direct interface capabilities between digital and analog circuits.

It should now be apparent that the present invention provides a digital-to-analog converter circuit employing a minimum number of active and passive components and which provides for the use of digital integrated switches in place of the heretofore used analog switches. Although particular components have been discussed in connection with the embodiment of the circuit constructed in accordance with the teachings of this invention, others may be utilized. Furthermore, it will be understood that although exemplary embodiment of the present invention has been disclosed and discussed, other applications and circuit arrangements are possible and that the embodiment disclosed may be subjected to various changes, modifications and substitutions without necessarily departing from the spirit of the invention.

What is claimed is:

1. A digital-to-analog converter using digital transistor switches comprising:

a nonconductive base member;

at least one digital integrated circuit attached to said base member said circuit having a plurality of digital input terminals, two power supply terminals and a plurality of digital transistor switches connected to one of said two power supply terminals, each transistor switch having an output terminal, said digital input terminals having coded combinations of digital voltage potentials applied thereto for rendering each of said transistor switches conductive and nonconductive between said output terminal and said one of said two power supply terminals according to a corresponding code, said transistor switches having an inherent voltage potential between said output terminal and said one of said two power supply terminals when rendered conductive;

A plurality of deposited layer resistors deposited upon said base member, each of said resistors being connected between a resistor common terminal and a switch output terminal, each switch output terminal having only one of said resistors connected thereto, said resistors being connected through said transistor switches to said one of said power supply terminals when said switches are conductive and disconnected therefrom when said switches are nonconductive;

At least one analog integrated circuit operational amplifier attached to said base member, said amplifier having one signal input terminal, one reference input terminal and one output terminal, said signal input terminal being connected to said resistor common terminal of said plurality of deposited layer resistors;

a compensating reference voltage source attached to said base member and having a first terminal connected to said reference input terminal of said analog integrated circuit and a second terminal connected to said one of said two power supply terminals of said digital integrated circuit, the other of said two power supply terminals having a voltage potential relative to said one of said power supply terminals substantially equal to the potential of said reference voltage source, said reference voltage source compensating for the inherent voltage potential of said switches when said switches are rendered conductive thereby maintaining a constant voltage across said deposited layer resistors connected to conductive switches;

a deposited layer polarity resistor deposited upon said base member, said polarity resistor having a first and second terminal, said first terminal connected to said resistor common terminal of said plurality of deposited layer resistors and said polarity resistor having a temperature coefficient of resistance matched to the temperature coefficient of said plurality of deposited layer resistors;

a polarity reference voltage source attached to said base member and connected between said reference input terminal of said analog integrated circuit and said polarity resistor second terminal; and, a deposited layer feedback resistor deposited upon said base member and connected between said signal input and said output terminals of said analog integrated circuit and having a temperature coefficient of resistance matched to said plurality of deposited layer resistors.

2. The digital-to-analog converter defined in claim 1 wherein said compensating reference voltage source comprises:

a first zener diode having a cathode and anode terminal with said cathode terminal connected to said reference input terminal of said analog integrated circuit; and, a first temperature compensating means connected between said first zener diode anode terminal and said one of said two power supply terminals for compensating the temperature coefficient of both said first zener diode and said inherent voltage potential of said transistor switches.

3. The digital-to-analog converter defined in claim 2 wherein said polarity reference voltage source comprises:

a second zener diode having a cathode and anode terminal with said cathode terminal connected to said polarity resistor second terminal; and a second temperature compensating means connected between said second zener diode anode terminal and said compensating reference voltage source providing temperature compensation for said second zener diode.

4. The digital-to-analog converter defined in claim 2 wherein said first temperature compensating means comprises:

a forward-biased diode having anode and cathode terminals with said diode anode terminal connected to said first zener diode anode terminal and said forward biased diode cathode terminal connected to said one of said two power supply terminals of said digital integrated circuit.

5. The digital-to-analog converter defined in claim 4 wherein said first temperature compensating means further comprises:

a transistor connected between the cathode of said forward-biased diode and said one of said two power supply terminals of said digital integrated circuit, said transistor having the base and collector terminals connected to said cathode and the emitter terminal to said one of said two power supply terminals.

6. The digital-to-analog converter defined in claim 3 further including current source means connected to said second zener diode cathode, comprising:

a transistor having an emitter, collector, and a base terminal said collector terminal being connected to said second zener diode cathode;

a first deposited layer resistor connected to said transistor base terminal;

a forward-biased diode having anode and cathode terminals said cathode terminal connected to said first resistor and said anode terminal having a biasing voltage potential applied thereto, said diode compensating for the temperature coefficient of the transistor emitter to base voltage; and, a second deposited layer resistor connected between said transistor emitter terminal and said diode anode terminal thereby determining the current supplied from the collector terminal of said transistor to said polarity resistor and said polarity reference voltage source in series with said compensating reference voltage source.